United States Patent [19]

Lebailly

[11] 3,803,460

[45] Apr. 9, 1974

[54] SEMICONDUCTOR DEVICE HAVING A MULTI-THICKNESS REGION

[75] Inventor: Jacques Lebailly, Canen, France

[73] Assignee: U.S. Philips Corporation, New York, N.Y.

[22] Filed: Nov. 16, 1972

[21] Appl. No.: 307,197

[30] Foreign Application Priority Data

Nov. 22, 1971 France .............................. 71.41735

[52] U.S. Cl.... 317/235 R, 317/234 N, 317/235 AJ, 317/235 AK, 313/108 D

[51] Int. Cl.......................... H01l 11/00, H01l 15/00

[58] Field of Search ............. 317/234, 5.4, 47, 47.1; 313/108 D

[56] References Cited

UNITED STATES PATENTS

| | | | |
|---|---|---|---|
| 2,395,743 | 2/1946 | Kannenberg | 317/234 AK |
| 2,672,528 | 3/1954 | Shockley | 317/235 AK |
| 3,255,055 | 6/1966 | Ross | 317/235 AK |
| 3,260,634 | 7/1966 | Clark | 317/235 AK |

*Primary Examiner*—Andrew J. James
*Attorney, Agent, or Firm*—Frank R. Trifari

[57] ABSTRACT

A semiconductor device comprising at least a first surface region and a second region that are separated by a junction having opposite conductivities, the first region being disposed over the second region and including a central zone and an annular peripheral zone having a thickness less than one-third that of the central zone. The peripheral zone separates the central zone from the boundary of the junction and exhibits high electrical resistance. Also, a method of producing such a semiconductor device.

7 Claims, 9 Drawing Figures

SEMICONDUCTOR DEVICE HAVING A MULTI-THICKNESS REGION

The present invention relates to a semiconductor device having at least two regions of opposite conductivity types separated by a junction: a first surface region, which includes both a central zone that comprises electric connection means located on a face opposite the junction and a peripheral zone which separates the central zone from the boundary of the junction and which is thinner than the central zone and shows a comparatively high resistance, and a second region present below the first region.

It is known that in junction-semiconductor devices the peripheral parts of a junction near the boundary of the junction with the surface of the device show a behaviour which differs from that of the part of the junction present in the mass of the semiconductor body. These surface effects are nearly always undesired; for example, in the case of electroluminescent diodes, the surface currents cause no radiation; in the case of diodes which are biased in the reverse direction and which are used, for example, in the avalanche condition, breakdown occurs at the surface at voltages which are lower than that which would permit the field strength in the mass of the device.

On the one hand it is endeavored to remove such said surface effects by covering the boundary of a junction with a layer of a dielectric material, for example, quartz. This method of passivating the junction cannot be used in all cases. For example, quartz poorly adheres to the surface of a plate made from a III-V compound, for example, gallium arsenide so that one has to resort to dielectric layers of different compositions lying one on top of the other. The deposited dielectrics moreover present several problems as regards purity and preparation of the surface condition.

Furthermore, such passivation often necessitates the heating of the semiconductor body at high temperatures which are detrimental to them or which certain materials cannot withstand because the dissociation temperature of such material is too low, for example, the II–VI compounds of the elements of the columns II and VI of the periodic table of elements.

In the case of electroluminescent diodes, the passivation does not eliminate the flow of currents through the regions which lie at the surface of the device near the boundary of the junction, which currents are comparatively important, since, although they produce no radiation, they do produce losses of efficiency which are the more significant with weaker excitation currents. Thus, in the case of small currents, the curve of the luminous power emitted as a function of the injected current deviates from the ideal regular curve which is a drawback, particularly when the device is coupled optically to a photodetector.

To mitigate this drawback, the central zone, or the principal inner zone, of the surface region of a plane diode has been surrounded by a high resistance annular zone so that, where the currents proceed in the direction of the boundary of the junction, the annular zone which separates the central zone from the boundary. Such a device is described in French Patent Specification 1,440,202 the annular zone there being diffused, via a porous dielectric, in such manner that said zone exhibits a high resistivity.

The problems resulting from the lack of adherence of the deposited dielectric to several compounds are not avoided in the method. The multiplicity of necessary masks, their different porosity, and the poorly defined boundaries of the zones may present new difficulties. In these devices it is preferred that the device include an extra annular contact which is placed near the periphery so that the part of the junction which should remain inoperative is short-circuited and ensures the desired results.

On the other hand, when, for example, a dielectric of quartz glass is used on a plate, diffusion extends laterally below the surface of the plate over a distance that is noticeably greater than the depth of the diffusion in the direction perpendicular to the surface. The carriers injected in the lateral diffused region easily reach the surface, where undesired recombinations occur (for example, non-radiative in an electroluminescent diode), the life of the carriers being too short in this region. Etching to a small depth the surface of the plate around the principal region, in particular in the zone of the boundary of the junction does not eliminate the junction so that it must be pasivated, which involves the already mentioned passivation difficulties.

It is an object of the invention to mitigate the above-mentioned drawbacks and to enable the manufacture of semiconductor devices which give better results than similar prior art devices without requiring difficult operations presenting danger for the semiconductor material.

Another object of the invention is to avoid the necessity of a passivation of the plane junction between two regions of different conductivity types.

The invention considers the variation in depth of the concentration of impurities, and hence the resistivity, in a region bounded by a junction, for example, a region diffused via a plane surface, in which the concentration varies with the depth dependent upon the diffusion conditions but which shows a minimum concentration at the deepest level near the junction.

According to the invention, the semiconductor device has at least two regions of opposite conductivity types separated by a junction: a first surface region comprising both a central zone that is provided with electric connection means at a face thereof opposite the junction and a peripheral zone that separates the central zone from the boundary of the junction, which periperal zone shows a comparatively high resistance and a smaller thickness than the central zone and a second region located below the first region both the central part of the junction which is present between the second region and the central zone of the first region and an annular part of the junction which adjoins the central part and is present between the second region and the peripheral zone of the first region lie in the same plane and the annular peripheral zone of the first region has a thickness which is less than one third of the thickness of the central zone of the first region.

Owing to the large difference in thickness, and hence the large difference in resistance, between the two zones of the first region of the device with respect to the junction (which is substantially plane at least for the greater part), the charge carriers injected by the contacts provided on the central zone must traverse the central zone in the direction of the junction. The current lines are channeled in the central zone and do not diverge in the direction towards the periphery and the boundary of the junction. In the peripheral zone, which has a small thickness and a high resistance, the current lines proceed substantially to the central plane of the junction, so that the current in the peripheral region is considerably reduced. FIG. 1 of the accompanying drawings is a diagrammatic cross-sectional view of a device having two regions of opposite conductivity types and shows the shape of the current lines which are shown in broken lines.

Since the periphery of the junction and the boundary thereof at the surface of the device are substantially not reached by the current lines, it is not necessary to effect a passivation of the surface.

The current lines are substantially rectilinear to the plane of the junction. The place of the contacts to be provided on the second region of the device is not shown, but such contacts may be chosen rather freely without endangering the advantages of the invention.

The surface currents in the peripheral zone of the first region having substantially disappeared, it is possible to obtain electroluminescent diodes of which the luminous power emitted as a function of the injected current is not disturbed by such surface currents and does not show any inflection for a small injected current.

Furthermore, in such a diode, the annular non-operative part of the diode does not emit any radiation as a result of which the contour of the light source is sharply defined.

In accordance with the dimensions of the crystal in which the device is formed and those of the surface of the central zone on which the contact means are provided, the boundary of the junction is present on an annular surface which is parallel to the active surface, for example, as in the device shown in FIG. 1, or on the lateral surface of the crystal, for example, as in the device shown in FIG. 2.

The annular peripheral zone of the first region preferably has a width which is at least equal to the thickness of the central zone of the first region and a resistivity which is larger than ten times the average resistance of the central zone of the first region. Such conditions contribute to ensuring the required high resistance in the peripheral zone.

The conditions of the dimensions and the electronic features of the device are preferably determined so that the relation:

$$\rho/2\pi e \text{ Log } r_2/r_1 \geqslant 10 R \text{ (Log is natural logarithm)}$$

is satisfied.

In this formula:

-$\rho$ = the resistivity of the peripheral zone of the first region

-$e$ = the thickness of the peripheral zone

-$r_2$ and $r_1$, respectively, are the average outer and inner radius of the annular surface of zone taken in a plane parallel to the junction and -R = the resistance in the transverse direction of the central zone measured between the junction and the plane which receives a contact electrode.

The device according to the invention can be manufactured by means of methods comprising only simple operations and without the danger of attack of the semiconductor material. The various regions and zones can be obtained, for example, by the local epitaxial deposition, but preferably by diffusion and removal of material.

The method of manufacturing a semiconductor device having at least two regions of opposite conductivity types separated by a plane junction includes producing a first surface region by diffusion of impurities from at least a part of one of the large faces of a semiconductor crystal, on which face a contact electrode of the device is deposited. After diffusion the material of the crystal is locally removed from the diffusion face to a depth which is at least two thirds of the distance between the diffusion face (i.e., the crystal face where diffusion is carried out) and the junction is present, such removal being carried out over a restricted part of the diffusion face, the restricted part being in the form of a wreath (i.e., annular) and comprising the boundary of the junction. The distance between the inner limits of the restricted part that is removed and the boundary of the junction is everywhere at least equal to the diffusion depth.

The inner limit of the semiconductor crystal surface across which the material is removed determines an operative region over one of the large faces of the device, on which face a contact electrode is deposited. The distance (A in FIG. 1) between the inner limit and the boundary of the junction makes it possible to obtain a considerably wide peripheral zone of the first region. Since the diffusion of impurities in a semiconductor plate of opposite conductivity type results in a concentration of impurities that is not uniform but shows a depth gradient, the resulting resistivity as a function of such concentration is high in the peripheral zone which remains after the removal of the material according to the invention, such resistivity being much higher than the average resistivity of the diffused region. Since, moreover, the peripheral zone has a very small thickness, current can be neglected and the current lines, when the device is biassed and fed, are substantially parallel and perpendicular to the junction and the currents are concentrated in the central zone of the device.

The material is removed preferably by a local chemical etching treatment of the surface of the plate. This etching necessitates a protective mask of the active surface of the central zone of the surface region of the device but the accuracy and the adherence of the mask are not critical and this operation does not show the difficulties and the danger involved in the prior art masks for the local diffusion.

At the surface, the extent of etching is, inter alia, restricted by, on the one hand, the active surface which is provided for the device and on the other hand by the desire of a minimum occupation of space. The distance between the inner limit of the extent of etching and the boundary of the junction is preferably larger than about ten times the thickness which is planned for the peripheral zone of the diffused region.

The known diffusion and etching methods make it possible to control the features of the resulting regions and junctions. It is thus possible to carry out the diffusion and the etching treatment as a function of the relations which it is desired to obtain for the value of the average resistivity $\rho$ in the peripheral zone of the surface region, of the thickness of the peripheral zone $e$, of the dimensions of the surface thereof and of the values of the average resistivity of the central zone and the dimensions of the central zone. In an annular zone having average inner and outer radii $r_1$ and $r_2$, respectively, the diffusion and etching are carried out according to the invention in such manner that the following equation is obtained:

$\rho/2\pi e \text{ Log } r_2/r_i \geqslant 10 R$, wherein R is the resistance in the transverse direction of the central zone of the diode, i.e., the resitance of the central zone between the junction and the face on which the contact is provided and from which the diffusion is carried out. For each individual case one of the values in the above equation is determined as a function of the other values which are given, a priori, or which are imposed so as to obtain the end in view.

In certain cases when the active surface of the device having a contact electrode, has a simple geometrical shape, for example, it is square or circular, the removal of the material can be obtained by mechanical grinding. This method may show certain advantages, for example, in the case in which the use of the method and the etching products are difficult or dangerous.

It is obvious that the device according to the invention may have several junctions and/or several diodes. A particularly advantageous method relates to mosaics of electroluminescent diodes which are formed, for example, according to an XY matrix.

The invention may be used for the manufacture of semiconductor devices according to the so-called planar methods, which are obtained starting from epitaxial or diffused plates, especially from composite materials with elements from the columns III and V of the periodic table of elements or with elements from the columns II and VI. The advantages of the invention are important in particular for the manufacture of electroluminescent diodes, avalanche diodes and diodes which are used at high voltages in the reverse direction. The invention may also be used in the case in which a semiconductor device is manufactured with materials or according to methods for the treatment of a surface which does not permit sufficient passivation.

The invention will be described in greater detail with reference to the accompanying drawings.

FIGS. 3*a* to 3*f* are diagrammatic sectional views showing the stages of a method of manufacturing a diode according to the invention.

Figure 4:
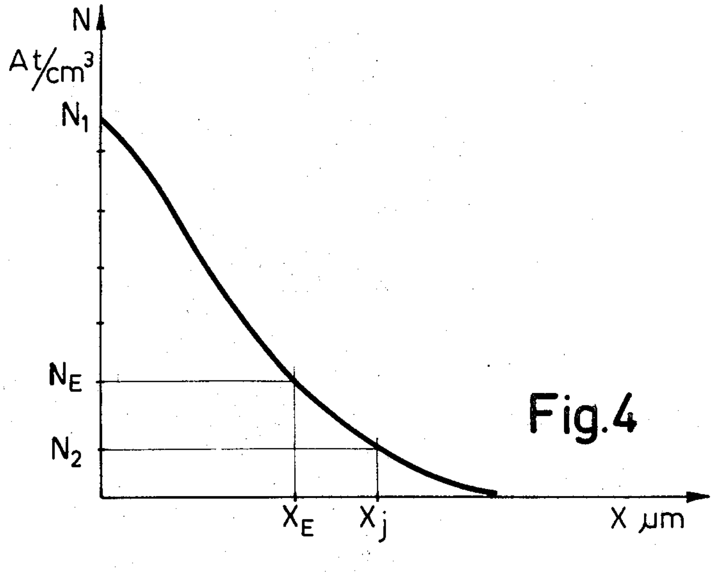

FIG. 4 is a curve which denotes the concentration of impurities of a diffused diode.

Figure 1:
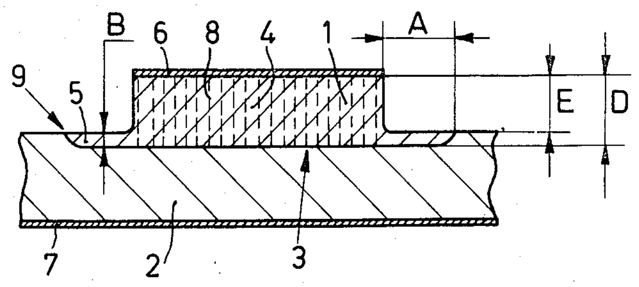
FIG. 1 is a diagrammatic sectional view of a diode manufactured according to the invention.

The diode shown in FIG. 1 comprises two regions of opposite conductivity types, a first surface region 1 and an underlying second region 2 which are separated by a plane junction 3. According to the invention, the surface region 1 comprises a central zone 4 and a peripheral zone 5, the resistivity of the latter being much higher than the average resistivity of the central zone 4.

Figure 2:
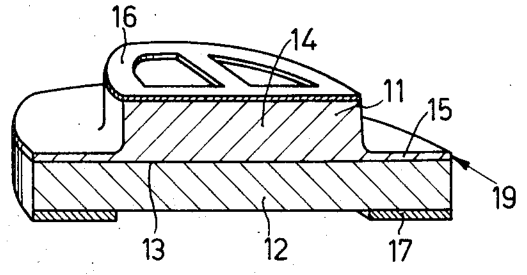
FIG. 2 is a perspective partial sectional view of another diode manufactured according to the invention.

The thickness B of the peripheral zone 5 in less than one third of the thickness D of the central zone, and the width A of the peripheral zone is large, preferably and at least as large as the thickness D of the central zone 4. As a result of this, if charge carriers are injected, for example, by the contact electrode 6, in the region 1, the current lines represented by the broken lines 8, are directed normally to the junction 3 but do not diverge in the direction of the boundary 9 of the junction, the peripheral zone 5 being traversed only by a negligible current and the surface to which the junction 9 adjoins need not be passivated. The surface adjoined by the junction is plane in the cases of the diode shown in FIG. 1, but a diode according to the invention may also have the another shape such as that shown in FIG. 2 in which the junction 13 adjoins the lateral surface of the diode at 19 between a surface region 11 and an underlying region 12. The peripheral zone 15 of the region 11 has a much higher resistivity than the central zone 14 of the same region and the current lines in the region 11 do not diverge in the direction of the boundary 19 of the junction, because the peripheral zone 15 has a very small thickness and a large width. The contact electrodes 16 and 17, respectively, are provided on the large faces of the crystal, their geometry being determined according to the function of the diode and exerting substantially no influence on the direction of the current lines.

The diffusion of a region 4 or of a region 14 according to the conventional methods, gives the region a concentration profile which can be compared, for example, with that shown in the graph of FIG. 4. In the graph, which denotes the concentration, N, of doping impurities (in number of atoms per unit by volume with a logarithmic scale) as a function of the depth $x$ (in microns), the initial concentration of the semiconductor body is denoted by an ordinate line $N_2$. The surface concentration of the diffused region is $N_1$ and the depth of the junction is $x_j$. The removal of the material according to the invention is carried out to a depth $x_E$, where the concentration is $N_E$, with:

$N_1 > 10\ N_E$ or even better $N_1 > 10^2\ N_E$.

Figure 3A:
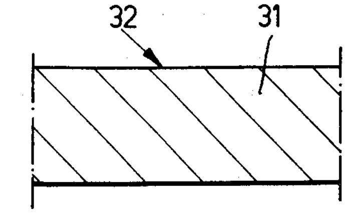
Figure 3D:
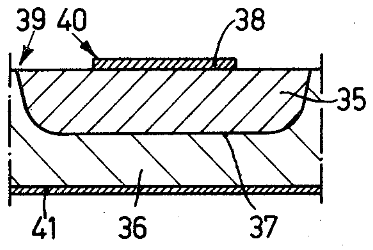
Figure 3B:
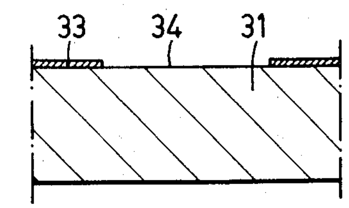
Figure 3E:
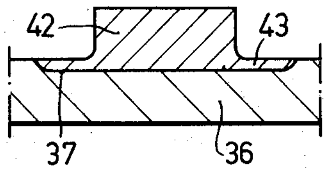
Figure 3C:
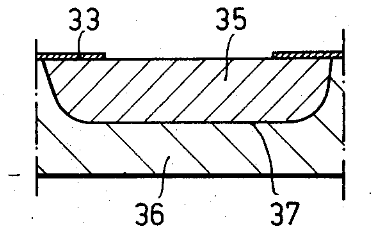
Figure 3F:
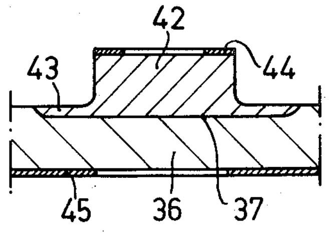

The manufacture of a diode of the type shown in FIG. 1 will now be described by way of, for example, an electroluminescent diode of gallium phosphide arsenide, the starting material being a monocrystalline body 31 of *n* conductivity type having a plane face 32 (FIG. 3*a*). On this face 32, a mask 33 for the local diffusion is provided by means of known photoetching methods. The mask comprises at least a window 34 having a diameter of 150 $\mu$m which, for example, may be circular (FIG. 3*b*) and through which a diffusion is then carried out, for example, of zinc from the vapour phase, from a gallium zinc source with 10 percent zinc. This diffusion, which is carried out at 850° for 1 hour, causes a 4 micron deep junction 37 between the diffused region 35 to which the diffusion has given the *p* conductivity type, and the remainder of the crystal which is *n* type (FIG. 3*c*). After elimination of the mask 33 another mask 38 is deposited on the same surface of the crystal (FIG. 3 *d*), the other mask 38 delimiting a central circular zone of the crystal which is protected from the subsequent etching treatment, the edge of the central zone being everywhere at least 5 $\mu$ from the boundary 39 of the junction 37, which distance is larger than the diffusion depth. The other faces of the device are protected, if desired, by a coating 41.

Etching is then carried out to a depth pf 3 $\mu$ (FIG. 3*e*) so as to leave of the region 35 as only a thick central zone 42 and a very thin peripheral zone 43. This etching is carried out, for example, at 60°C for 20 seconds in a solution of three parts of $H_2SO_4$, one part of $H_2O_2$, and one part of $H_2O$. After removing the masks and the protective coatings, the electrodes 44 and 45 (FIG. 3*f*) are deposited on the two oppositely located faces of the device according to the conventional methods, for example, by vapour deposition in a vacuum.

What is claimed is:

1. A semiconductor device comprising at least a first surface region of first conductivity type and a second region of opposite conductivity type located below said first surface region and separated therefrom by a junction, said first surface region comprising an outwardly projecting central zone, electric connection means disposed on a face of said central zone opposite and parallel to said junction and an annular peripheral zone comprising a surface parallel to said face of said central zone, said peripheral zone separating said central zone from the boundary of said junction and being characterized by a comparatively high electrical resistance, said junction comprising a central part disposed between said second region and said central zone of said first region and an annular part which adjoins said central part and is disposed between said second region and said peripheral zone of said first region, said central part and said annular part of said junction lying in the same plane and said annular peripheral zone of said first region having a thickness which is less than one third of the thickness of said central zone of said first region.

2. A device as recited in claim 1, wherein said junction is bounded by an annular surface which is parallel to said face of said central zone.

3. A device as recited in claim 1, wherein said junction is bounded by lateral faces of said device.

4. A device as recited in claim 1, wherein said annular peripheral zone of said first region has a width which is at least equal to the thickness of said central zone.

5. A device as recited in claim 1, wherein said peripheral zone of said first region has a resistivity which is larger than ten times the average resistivity of said central zone of said first region.

6. A device as recited in claim 1, wherein the resistivity of said peripheral zone of said first region, the thickness $e$ of said peripheral zone, the average radii $r_1$ and $r_2$ of the annular outer surface of said peripheral zone and the resistance R in the transverse direction of said central zone satisfy the conditions $\rho/2\ \pi\ e\ \mathrm{Log}\ r_2/r_1 \geqslant 10\ R$, where Log is the natural logarithm.

7. A device as recited in claim 1, wherein said junction is an electroluminescent junction.

* * * * *